(12) United States Patent
Okada et al.

(10) Patent No.: US 11,092,465 B2
(45) Date of Patent: Aug. 17, 2021

(54) OPTICAL ENCODER

(71) Applicant: SHARP KABUSHIKI KAISHA, Sakai (JP)

(72) Inventors: Norikazu Okada, Osaka (JP); Masaki Tsuji, Osaka (JP); Toshiyuki Takada, Osaka (JP); Katsunori Satoh, Osaka (JP); Takashi Takaoka, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 303 days.

(21) Appl. No.: 15/306,160

(22) PCT Filed: Feb. 20, 2015

(86) PCT No.: PCT/JP2015/054864
§ 371 (c)(1),
(2) Date: Oct. 24, 2016

(87) PCT Pub. No.: WO2015/162987
PCT Pub. Date: Oct. 29, 2015

(65) Prior Publication Data
US 2017/0045381 A1 Feb. 16, 2017

(30) Foreign Application Priority Data
Apr. 25, 2014 (JP) .............................. JP2014-091877

(51) Int. Cl.
*G01D 5/34* (2006.01)
*G01D 5/347* (2006.01)
(Continued)

(52) U.S. Cl.
CPC ........... *G01D 5/34* (2013.01); *G01D 5/34715* (2013.01); *G01D 5/363* (2013.01); *H03K 17/943* (2013.01); *H03K 2217/94108* (2013.01)

(58) Field of Classification Search
CPC ...... G01D 5/34715; G01D 5/363; G01D 5/34; H03K 17/943
(Continued)

(56) References Cited

U.S. PATENT DOCUMENTS 4,658,132 A * 4/1987 Nishiura ................. G01P 3/486
250/231.14
5,486,925 A * 1/1996 Sano .................. G01D 5/24476
341/13
(Continued)

FOREIGN PATENT DOCUMENTS

JP 2014-2078 A 3/1982
JP 59-40258 A 3/1984
(Continued)

*Primary Examiner* — Georgia Y Epps
*Assistant Examiner* — Kevin Wyatt
(74) *Attorney, Agent, or Firm* — Birch, Stewart, Kolasch & Birch, LLP

(57) ABSTRACT

An optical encoder includes first, second, and third light receiving elements (A, B, C) that are sequentially disposed and adjacent to each other; and a detection signal generation unit (50) that outputs a detection trigger (Ts) when an output level of the second light receiving element (B) that receives incident light after the first light receiving element (A) is higher than an output level of the first light receiving element A, and outputs a non-detection trigger (Te) when an output level of the third light receiving element (C) that receives incident light after the second light receiving element (B) is higher than the output level of the second light receiving element (B).

7 Claims, 12 Drawing Sheets

(51) Int. Cl.
*G01D 5/36* (2006.01)
*H03K 17/94* (2006.01)

(58) Field of Classification Search
USPC .................................. 250/231.1, 231.13–18
See application file for complete search history.

(56) References Cited

U.S. PATENT DOCUMENTS

| | | | | |
|---|---|---|---|---|
| 5,759,155 | A * | 6/1998 | Miyagawa | G01D 5/34723 600/459 |
| 7,554,079 | B2 * | 6/2009 | Rai | G01D 5/24461 250/231.13 |
| 7,820,957 | B2 * | 10/2010 | Kimura | G01D 5/36 250/214.1 |
| 2005/0238365 | A1 * | 10/2005 | Tan | G01D 5/24404 398/183 |
| 2009/0266178 | A1 * | 10/2009 | Matzoll, Jr. | G01D 5/342 73/862.326 |
| 2013/0258352 | A1 | 10/2013 | Fukuhara | |
| 2014/0138525 | A1 * | 5/2014 | Ito | G01D 5/34715 250/231.1 |

FOREIGN PATENT DOCUMENTS

JP  2007-17390 A  1/2007
JP  2013-195180 A  9/2013

* cited by examiner

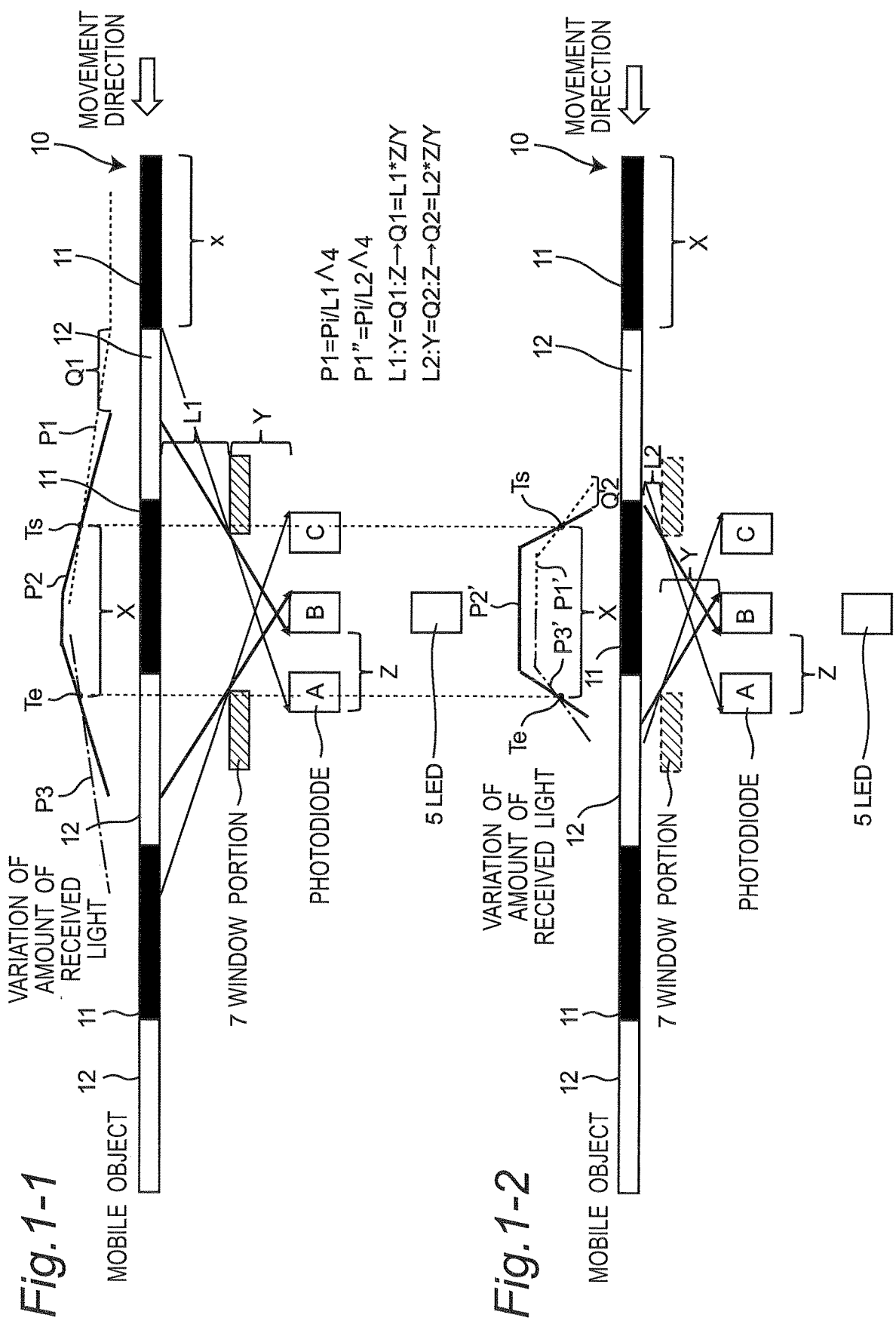

WHEN A<B

WHEN A>B

OPTICAL ENCODER

TECHNICAL FIELD

The present invention relates to an optical encoder which detects a position, a movement speed, a movement direction, or the like of a mobile object, using light receiving elements, and particularly to an optical encoder which is preferably used for a copier, a printing apparatus such as a printer, a factory automation (FA) apparatus, a lens focus adjusting device of a camera or the like, a speed detection device for vehicle which detects a rotation angle, a speed, or the like of a crank shaft.

BACKGROUND ART

In the related art, as described in PTL 1 (Japanese Unexamined Patent Application Publication No. 59-40258), there is a device which detects a position, a movement speed, or the like of a mobile object by using a differential output between photodiodes disposed in a light projecting portion and a light shielding portion of the mobile object, as an optical encoder.

In addition, an optical encoder in which a recess portion of a roughness portion of a detection object is larger than half of a projection portion is described in PTL 2 (Japanese Unexamined Patent Application Publication No. 2013-195180).

In addition, an optical encoder which has a resolution switch function of a photodiode and changes a base voltage according to switching is described in PTL 3 (Japanese Unexamined Patent Application Publication No. 2014-2078).

An optical encoder which outputs each of the photodiodes adjacent to each other as a digital signal and outputs rotation and a movement direction of a mobile object according to a detection order of the digital signal is described in PTL 4 (Japanese Unexamined Patent Application Publication No. 2007-17390).

CITATION LIST

Patent Literature

PTL 1: Japanese Unexamined Patent Application Publication No. 59-40258

PTL 2: Japanese Unexamined Patent Application Publication No. 2013-195180

PTL 3: Japanese Unexamined Patent Application Publication No. 2014-2078

PTL 4: Japanese Unexamined Patent Application Publication No. 2007-17390

SUMMARY OF INVENTION

Technical Problem

However, the optical encoder in the related art has the following problems.

As described in PTL 1, an optical encoder which detects a movement speed and a movement direction of a mobile object includes photodiodes which are disposed in proportion to a slit width of the mobile object, and thus, the optical encoder is unable to detect a movement speed and a movement direction of a mobile object having a different slit width. That is, there is a problem that detection accuracy depends upon the accuracy of a slit width of a mobile object.

In addition, in a case where a light emitting diode (LED) does not obtain parallel light, light also enters a light non-detection portion, and a duty ratio according to a distance between light emission and light reception is deteriorated. That is, there is a problem that detection accuracy of the optical encoder of PTL 1 depends upon an optical system.

In the optical encoder of PTL 2, photodiodes need to be disposed according to roughness even in a detection object having roughness, and the same problem as in the above description occurs.

In the optical encoder of PTL 3, a resolution switch function is provided, switching is limited, and the same problem as in the above description occurs.

There is a detecting method performed by infrared radiation as a method in which the optical encoder does not depend upon a slit width of the mobile object, as described in PTL 4. In the method, the optical encoder does not depend upon a slit width but a resolution varies according to a threshold level to be set, and thus, great variation of performance occurs due to variation of optical conditions. A differential operation between two photodiodes is performed as another precedent, and in contrast to this, processing is performed by a single photodiode, and thus, there is also a possibility that abnormal operation is performed to detect a movement direction.

Hence, an object of the present invention is to provide an optical encoder which does not depend upon a slit or a resolution of a reflection region of a mobile object, and does not depend upon variation of an optical system, and accordingly, holds a high SN ratio (signal to noise ratio), and detects a position, a movement speed, or the like of the mobile object, with high accuracy.

Solution to Problem

In order to solve the aforementioned problems, an optical encoder according to the present invention includes first, second, and third light receiving elements that are sequentially disposed and adjacent to each other; and a detection signal generation unit that outputs a detection trigger when an output level of the second light receiving element that receives incident light after the first light receiving element is higher than an output level of the first light receiving element that precedently receives the incident light, and outputs a non-detection trigger when an output level of the third light receiving element that receives incident light after the second light receiving element is higher than the output level of the second light receiving element.

The optical encoder according to the first embodiment further includes a light emitting element that has an optical axis substantially overlapping an optical axis of the second light receiving element; and a window portion that narrows light receiving apertures of the first and third light receiving elements.

In the optical encoder according to the first embodiment, areas of light receiving portions of the first, second, and third light receiving elements are substantially the same.

In the optical encoder according to the first embodiment, two sets of elements each including the first, second, and third light receiving elements are arranged in juxtaposition to each other.

The optical encoder according to the first embodiment further includes capacitors that can be respectively connected to the first, second, and third light receiving elements through switches and that are each connected in parallel with respective light receiving elements; and a switch control circuit that controls the switches.

An electronic apparatus according to the embodiment includes the optical encoder described above.

Advantageous Effects of Invention

According to the present invention, the optical encoder does not depend upon a slit or a resolution of a reflection region of a mobile object, and does not depend upon variation of an optical system, and accordingly, holds a high SN ratio (signal to noise ratio), and detects a position, a movement speed, or the like of the mobile object, with high accuracy.

BRIEF DESCRIPTION OF DRAWINGS

FIG. 1-1 illustrates a case where a distance between a mobile object and a window portion is long, and FIG. 1-2 illustrates a case where the distance between the mobile object and the window portion is shorter than the distance of the case of FIG. 1-1.

FIG. 2-1 and FIG. 2-2 are diagrams illustrating an optical simulation result of the amount of received light of first to third photodiodes when a distance between the first to third photodiodes and the mobile object is 4 mm.

FIG. 3-1 and FIG. 3-2 are diagrams illustrating an optical simulation result of the amount of received light of the first to third photodiodes when a distance between the first to third photodiodes and the mobile object is 8 mm.

FIG. 5-1, FIG. 5-2, FIG. 5-5 illustrate waveforms of each unit or portion of the optical encoder according to the first embodiment of the present invention, FIG. 5-1 illustrates an input (input light current) from the first to third photodiodes, FIG. 5-2 illustrates a set signal, FIG. 5-3 illustrates a reset signal, FIG. 5-4 illustrates an output waveform of an RS flip-flop, and FIG. 5-5 illustrates an output voltage from a logic circuit.

FIG. 7-1 and FIG. 7-2 are diagrams illustrating that an intersecting point of an output does not change even if the amount of incident light changes.

DESCRIPTION OF EMBODIMENTS

Hereinafter, the present invention will be described in detail by using the illustrated embodiments.

First Embodiment

Figure 2:
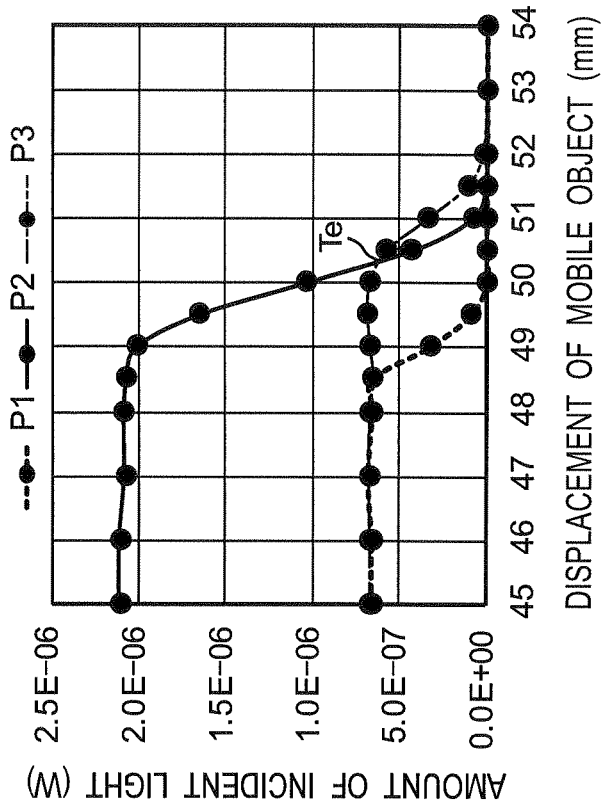
FIG. 1-1 and FIG. 1-2 are diagrams illustrating a relationship between position and a change of the amount of received light of a photodiode of an optical encoder according to a first embodiment of the present invention.
Figures 1, 2:
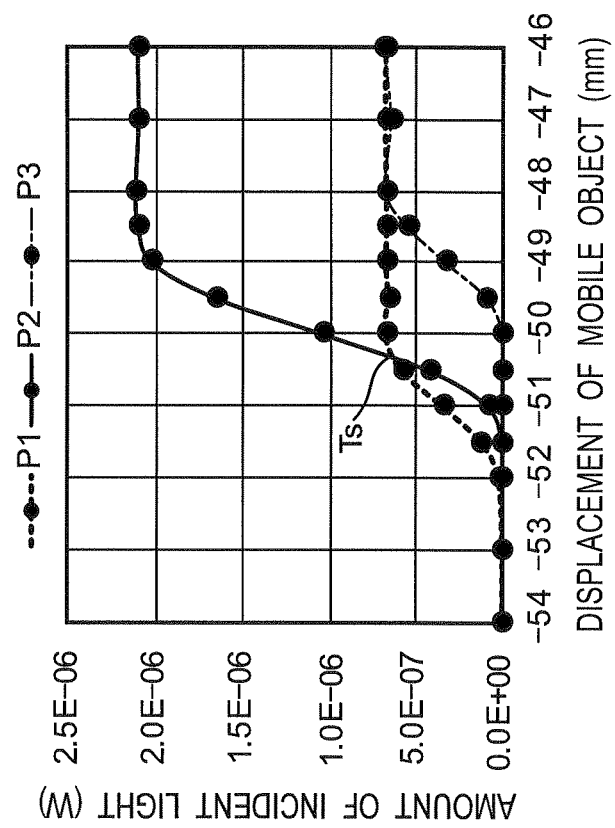

As described in FIG. 1-1, first, second, and third photodiodes A, B, and C are sequentially disposed at equally-spaced intervals in parallel with a mobile object 10 in a movement direction of the mobile object 10, as an example of first, second, and third light receiving elements. The first, second, and third photodiodes A, B, and C are arranged at an equal pitch Z. Areas of light receiving portions of the first, second, and third photodiodes A, B, and C are approximately equal to each other.

In addition, a light emitting diode (LED) 5 which is an example of a light emitting element is disposed on a side opposite to the mobile object 10 with respect to the second photodiode B, and an optic axis of the light emitting diode substantially overlaps an optic axis of the second photodiode B. Meanwhile, direct light from the LED 5 is not incident on the first, second, and third photodiodes A, B, and C, and a light-shielding plate (not illustrated) is provided so as to be able to detect light reflected by the mobile object 10.

In addition, a window portion 7 is provided between the mobile object 10 and the first, second, and third photodiodes A, B, and C. The window portion 7 overlaps a part of light receiving apertures of the first and third photodiodes A and C in an optic axis direction, and narrows the light receiving apertures of the first and third photodiodes A and C.

The mobile object 10 includes the reflection regions 11 and transmission regions 12 which are alternately arranged at an equally spaced interval. The reflection regions 11 and the transmission regions 12 have the same length X in the movement direction. The optical encoder according to the first embodiment is an encoder of a reflection type, but in a case of an encoder of a transmission type, a light emitting diode may be provided on a side opposite to that of the first embodiment with respect to the mobile object, while not illustrated.

In FIG. 1-1, L1 indicates a distance between a lower surface of the mobile object 10 and an upper surface of the window portion 7, Y indicates a distance between a plane passing through an upper end surface of the first, second, and third photodiodes A, B, and C and a plane passing through an upper end surface of the window portion 7, and Q1 indicates a movement distance (that is, movement distance of the mobile object 10) of the reflection region 11 from time when reflected light from the reflection region 11 starts to be incident on the first photodiode A to time when the reflected light from the reflection region 11 is incident on the second photodiode B as the mobile object 10 moves.

In FIG. 1-2, a distance L2 between the mobile object 10 and the window portion 7 is shorter than the distance L1 between the mobile object 10 and the window portion 7 in FIG. 1-1. Q2 indicates a movement distance (that is, movement distance of the mobile object 10) of the reflection region 11 from time when reflected light from the reflection region 11 starts to be incident on the first photodiode A to time when the reflected light from the reflection region 11 is incident on the second photodiode B as the mobile object 10 moves. Regarding others, configuration elements illustrated in FIG. 1-2 are the same as the configuration elements illustrated in FIG. 1-1, and thus, the same symbols or reference numerals are attached to the same configuration elements and detailed description thereof will be omitted.

In FIG. 1-1, Pi indicates a predetermined amount of light corresponding to the amount of emitted light of a light emitting diode 5, P1 indicates the amount of light that the first photodiode A receives, P2 indicates the amount of light that the second photodiode B receives, and P3 indicates the amount of light that the third photodiode C receives. In addition, in (FIG. 1-2), P1' indicates the amount of light that the first photodiode A receives, P2' indicates the amount of light that the second photodiode B receives, and P3' indicates the amount of light that the third photodiode C receives.

In addition, in FIG. 1-1 and FIG. 1-2, Ts indicates a point of time when a detection trigger is outputted, and Te indicates a point of time when a non-detection trigger is outputted.

In FIG. 1-1 and FIG. 1-2, the amounts of light receiving P1 and P1' satisfy the following expressions.

$$P1 = Pi/L1^4$$

$$P1' = Pi/L2^4$$

Here, the reason why the amount of received light is reduced in inverse proportion to a biquadrate of the distances L1 and L2 is that the amount of light is reduced in inverse proportion to square until light passing through the window portion 7 is reflected by the reflection region 11 of the mobile object 10, and furthermore the amount of light is reduced in inverse proportion to square until reaching the window portion 7 after the light is reflected by the reflection region 11. As a result, it can be assumed that the amount of light is reduced in inverse proportion to a biquadrate of the distances L1 and L2. By doing so, the reasonable amount of light corresponding to an actual value is obtained.

In addition, the movement distances Q1 and Q2 satisfy the following expressions from a relationship between similar triangles in FIG. 1-1 and FIG. 1-2.

$$L1: Y = Q1: Z \rightarrow Q1 = L1 \times Z/Y$$

$$L2: Y = Q2: Z \rightarrow Q2 = L2 \times Z/Y$$

In the optical encoder having the aforementioned configuration, if the mobile object 10 moves in a direction denoted by an arrow of the figure, the reflected light from the reflection region 11 on a right end of the mobile object 10 is incident on the first photodiode A through an upper portion of a right corner of the window portion 7 from a time period of the reflection region 11 as illustrate by a fine line, in FIG. 1-1. Thereafter, the mobile object 10 progresses by the distance Q1. If light starts to be incident on the second photodiode B and furthermore the mobile object 10 progresses, the amount of received light P2 of the second photodiode B is more than, that is, larger than the amount of received light P1 of the first photodiode A, as denoted by a thick line. At this point of time Ts, a detection trigger is outputted.

As described above, a variation tilt of light receiving from time when light is incident on the first and second photodiodes A and B to time when maximum reflected light is incident is determined depending upon tilts of end portions of the first and second photodiodes A and B and a tilt of a right corner of the window portion 7, and an intersecting point between the first and second photodiodes A and B is determined.

Thereafter, if the reflection region 11 of the mobile object 10 moves near an end of an aperture of the window portion 7, the amount of received light P3 of the third photodiode C is more than the amount of received light P2 of the second photodiode B, that is, the non-detection trigger outputs Te is outputted at the point of time Te when a curve P2 intersects a curve P3.

As described above, a variation tilt of light receiving from time when light is incident on the second and third photodiodes B and C to time when maximum reflected light is incident is determined depending upon tilts of end portions of the second and third photodiodes B and C and a tilt of a left corner of the window portion 7, and an intersecting point between the second and third photodiodes B and C is determined.

If the detection trigger Ts and the non-detection trigger Te are obtained by doing so, a pulse signal can be obtained which does not depend upon a width X of the trigger of the mobile object 10, that is, a resolution of the width X of the reflection region 11 and can hold a high SN ratio.

Meanwhile, in order to obtain the pulse signal according to the width X of the trigger, the width X needs to be disposed to be greater than an interval Z between the photodiodes.

Furthermore, the amount of reflected light from the central portion of the mobile object 10 also affects variation of light which is incident in FIG. 1-1 and FIG. 1-2, and thus, it is preferable that X is wider than a width of the window portion.

As described in FIG. 1-2, according to the method, it is possible to obtain the pulse signal according to the width X of the reflection region 11 in the same manner as in FIG. 1-1, even in a case where the distance L2 between the mobile object 10 and the first, second, and third photodiodes A, B, and C is shorter than the distance L1 illustrated in FIG. 1-1. This is due to the fact that the amount of received light is inversely proportional to four squares of a distance, and as shown in FIG. 1-2, the amount of received light of the first, second, and third photodiodes A, B, and C increases, but a variation tilt of light receiving from time when light is incident on the first, second, and third photodiodes A, B, and C to time when maximum reflected light is incident on is determined depending upon the tilts of end portions of the first, second, and third photodiodes A, B and C and tilts of the corners of the window portion 7, and thus, there is no variation in the intersecting points Ts and Te of a light receiving signal itself.

P1', P2', and P3' in FIG. 1-2 respectively correspond to P1, P2, and P3 in FIG. 1-1.

Figures 2, 3:
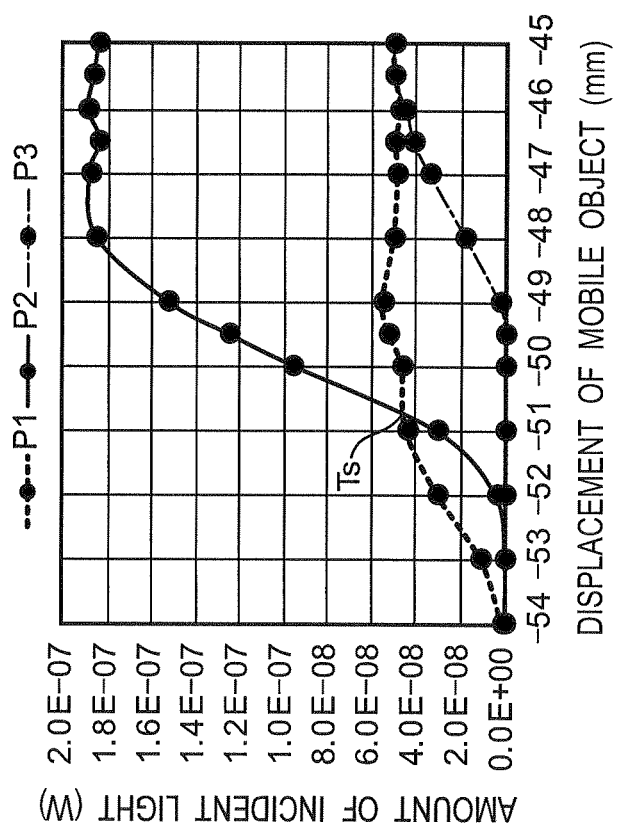
Figures 1, 3:
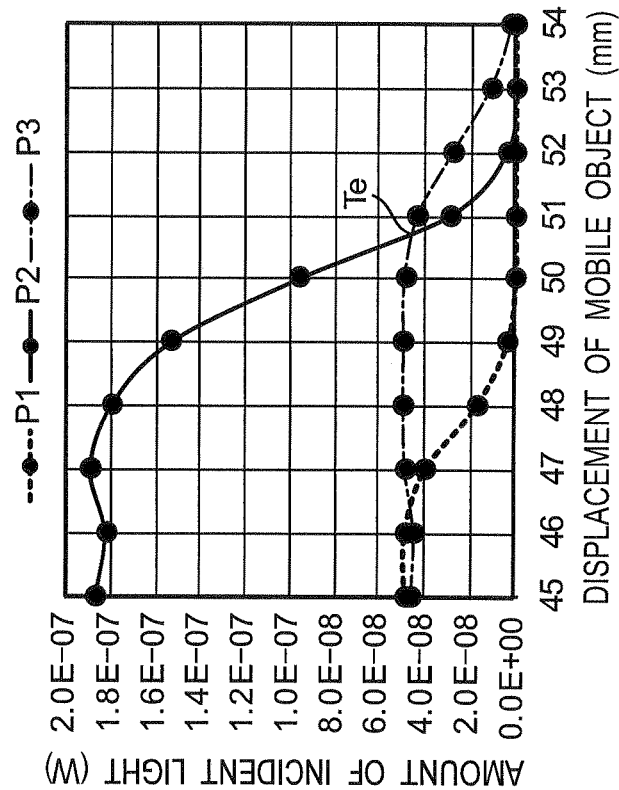

Optical simulation results are illustrated in FIGS. 2-1 and 2-2, and FIGS. 3-1 and 3-2. FIG. 2 illustrates a case where a distance between the mobile object 10 and the first, second, and third photodiodes A, B, and C is 4 mm, and FIGS. 3-1 and 3-2 illustrate a case where a distance between the mobile object 10 and the first, second, and third photodiodes A, B, and C is 8 mm. The mobile object 10 has a width of 100 mm.

In FIGS. 2-1 and 2-2 and FIGS. 3-1 and 3-2, dashed lines indicate the amount of light which is incident on the first photodiode A, solid lines indicate the amount of light which is incident on the second photodiode B, and alternate long and short dash lines indicate the amount of light which is incident on the third photodiode C.

It can be seen from FIG. 2 and FIG. 3 that, even if the distance between the mobile object 10 and the first, second, and third photodiodes A, B, and C changes from 4 mm to 8 mm, the intersecting points Te and Te, that is, points Te and Te in which the detection trigger and the non-detection trigger are outputted do not change, and are stabilized.

Hence, according to a principle of the present invention, a slit width of the mobile object is not fixed and the optical encoder does not depend upon variation of an optical system. Accordingly, it is possible to hold a high SN ratio and to detect a position, a movement speed, or the like of the mobile object, with high accuracy.

Figure 4:
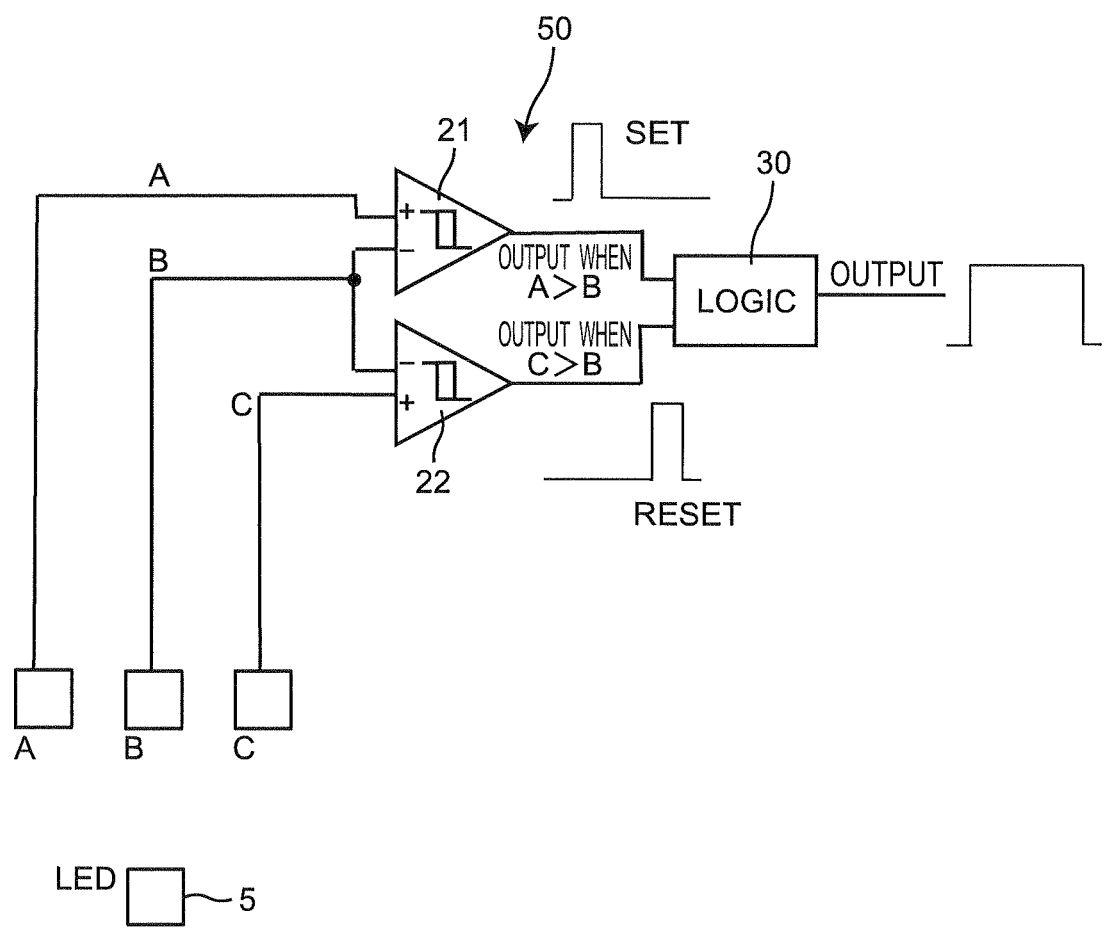
FIG. 4 is a circuit block diagram of the optical encoder according to the first embodiment of the present invention.

FIG. 4 is a diagram illustrating a circuit configuration of the optical encoder according to the first embodiment of the present invention. The optical encoder includes two comparators 21 and 22 and a logic circuit 30, as illustrated in FIG. 4, in addition to the configuration illustrated in FIGS. 1-1 and 1-2. The two comparators 21 and 22 and the logic circuit 30 configure a detection signal generation unit 50, and output an output voltage illustrated in FIG. 5-5, as will be described below. Rising of the output voltage of FIG. 5-5 corresponds to the detection trigger Ts and falling of the output voltage corresponds to the non-detection trigger Te.

The comparator 21 includes a positive terminal receiving an output A of the first photodiode A and a negative terminal receiving an output B of the second photodiode B, and outputs a set signal (SET) when A>B. In addition, the comparator 22 includes a positive terminal receiving an output C of the third photodiode C and a negative terminal receiving the output B of the second photodiode B, and outputs a reset signal (RSET) when C>B.

In FIGS. 1-1 and 1-2 and the like, the first photodiode A, the second photodiode B, and the third photodiode C are respectively denoted by P1, P2, and 93, and in contrast to this, the first photodiode A, the second photodiode B, and the third photodiode C are respectively denoted by A, B, and C herein. This is due to the fact that a relationship between the first photodiode A and the output A is easy to know and there is no likelihood of confusion. Of course, the output P1 indicates the output A, the output 92 indicates the output B, and the output P3 indicates the output C. Hereinafter, the same will be applied to the following description.

Figures 1, 5:
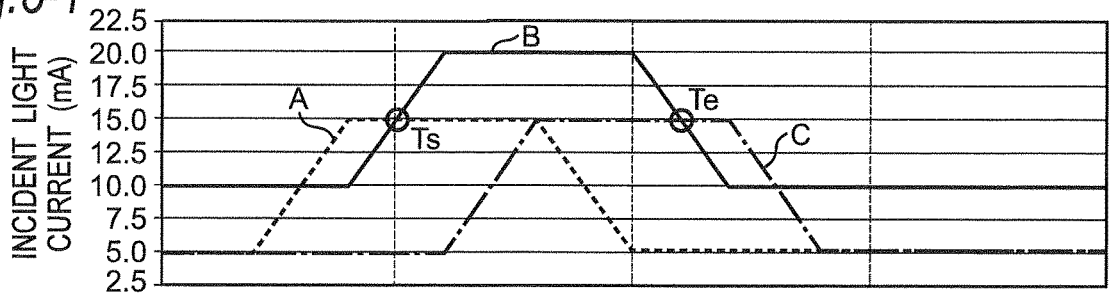
Figures 2, 5:
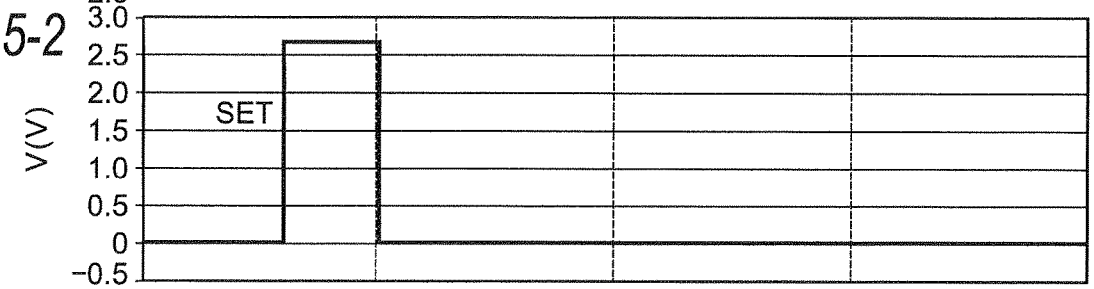
Figures 3, 5:
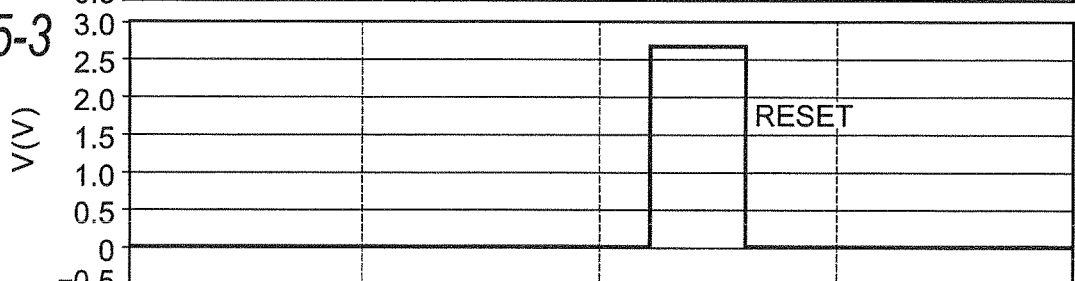
Figures 4, 5:
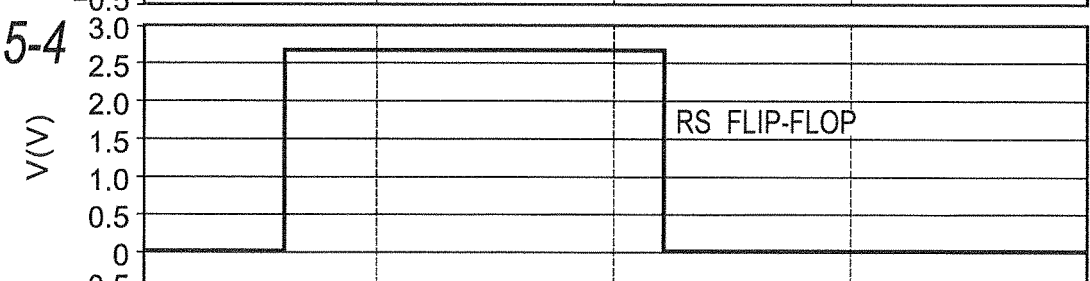
Figure 5:
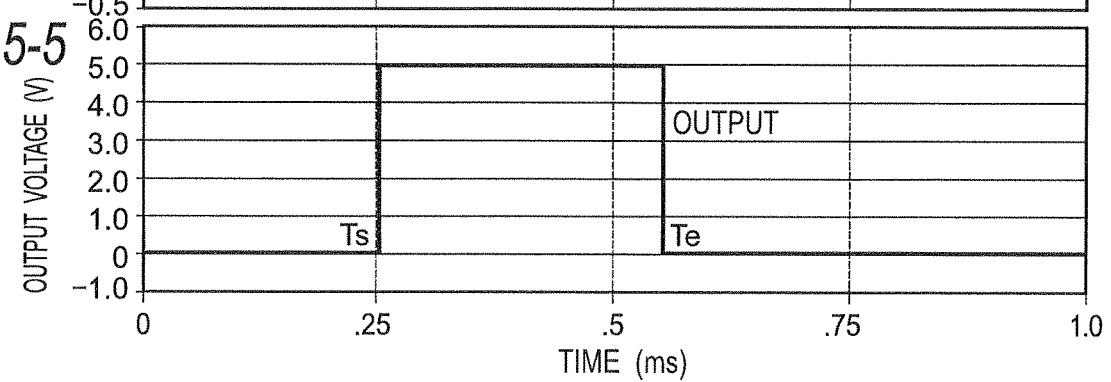

The outputs A, B, and C of the first, second, and third photodiodes A, B, and C are respectively denoted by curves A, B, and C of FIG. 5-1.

The set signal which is outputted from the comparator 21 is denoted by a curve of FIG. 5-2, and meanwhile, the reset signal which is outputted from the comparator 22 is denoted by a curve of FIG. 5-3.

Figure 6:
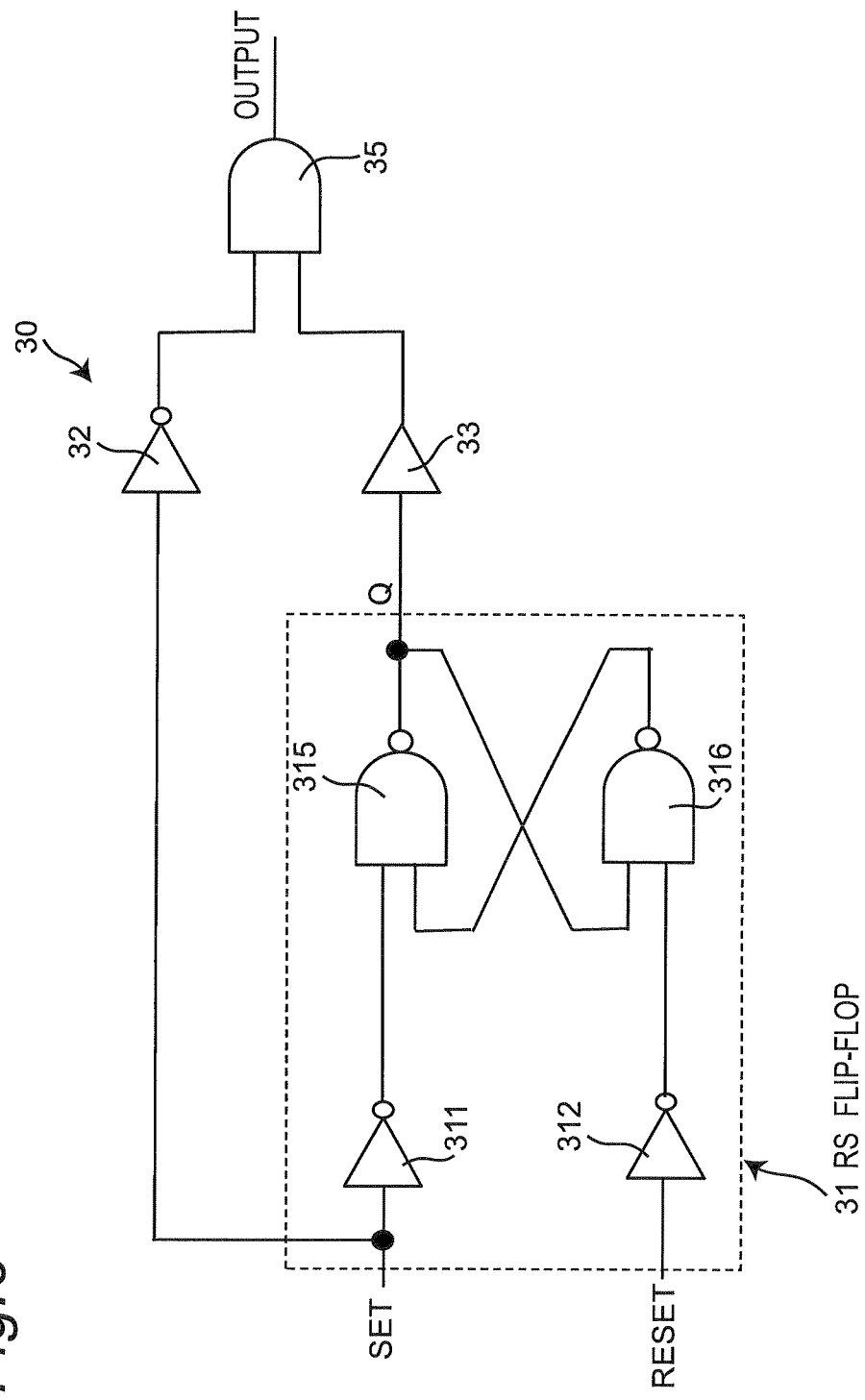
FIG. 6 is a detailed block diagram of a logic circuit of the optical encoder according to the first embodiment of the present invention.

Meanwhile, the logic circuit 30 has, for example, a configuration illustrated in FIG. 6, and is configured with an RS flip-flop 31, an inverter 32, an amplifier 33, and an AND gate 35.

An output of the inverter 32 is obtained by inverting the set signal of FIG. 5-2. In addition, the AND gate 35 outputs an output voltage illustrated in FIG. 5-5 by performing a logical product of an output, which is outputted from the amplifier 33, of the RS flip-flop 31 illustrated in FIG. 5-4, and a signal which is outputted from the inverter 32 and is obtained by inverting the set signal of FIG. 5-2.

In this way, the detection signal generation unit 50 outputs the output voltage of FIG. 5-5, and can output the detection trigger Ts which is rising of the output voltage and the non-detection trigger Te which is falling of the output voltage.

That is, while the detection signal generation unit 50 outputs the detection trigger Ts when an output level B of the second photodiode B that receives incident light after the first photodiode A is higher than an output level A of the first photodiode A that precedently receives the incident light, the detection signal generation unit 50 outputs the non-detection trigger Te when an output level C of the third photodiode C that receives incident light after the second photodiode B is higher than the output level B of the second photodiode B.

Hence, the optical encoder does not depend upon a resolution of a slit width or the like of the mobile object 10, and does not depend upon variation of an optical system. Accordingly, it is possible to hold a high SN ratio and to detect a position, a movement speed, or the like of the mobile object 10, with high accuracy.

In addition, as illustrated in FIGS. 1-1 and 1-2, in the first embodiment, a light emitting diode 5 having an optical axis which substantially overlaps an optical axis of the second photodiode B is included, the window portion 7 which narrows the light receiving aperture of the second photodiode B which is located as the center is not narrowed, the light receiving apertures of the first and third photodiodes A and C is included, and thus, the intersecting points Ts and Te in which a light receiving current B of the second photodiode B is more than light receiving currents A and C of the first and third photodiodes A and C can be obtained stably and reliably. Accordingly, it is possible to reliably obtain the detection trigger Ts and the non-detection trigger Te. In addition, the optical encoder does not depend upon a resolution of a slit width or the like of the mobile object 10 and does not depend upon variation of an optical system, and thus, it is possible to hold a high SN ratio and to detect a position, a movement speed, or the like of the mobile object 10, with high accuracy.

In addition, in the first embodiment, the light receiving portions of the first, second, and third photodiodes A, B, and C are substantially the same and a differential operation is performed by the comparators 21 and 22 as illustrated in FIG. 4. Accordingly, a common mode noise can be reduced, and thus, the first embodiment is beneficial.

Figures 1, 7:
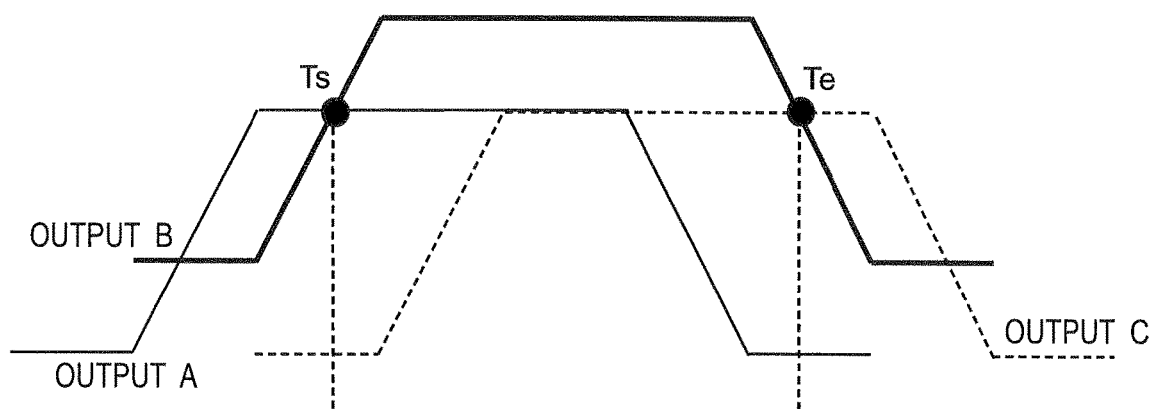
Figures 2, 7:
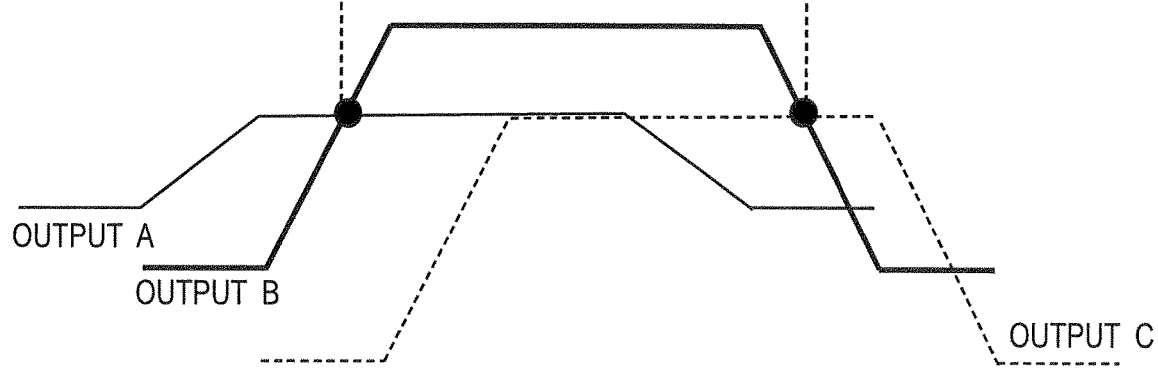

In addition, in the first embodiment, while the intersecting point Ts between the output A of the first photodiode A and the output B of the second photodiode B is set to the detection trigger Ts, the intersecting point Te between the output B of the second photodiode B and the output C of the third photodiode C is set to the non-detection trigger Te, as illustrated in FIG. 5-1, and thus, the intersecting points Ts and Te are not affected by external disturbance light, even if the amount of incident light changes, for example, from a state of A<B illustrated in FIG. 7-1 to a state of A>B illustrated in FIG. 7-2. Hence, it is possible to prevent an abnormal operation from being performed and to correctly detect a position, a movement speed, or the like of the mobile object 10.

In more detail, if an output, which is illustrated in FIG. 5-4, of the RS flip-flop 31 illustrated in FIG. 6 is used for the detection trigger as it is, a state where attenuation of the amount of received light of the third photodiode C illustrated in FIG. 5-1 is delayed, a state where the amount of received light is reversed between the second and third photodiodes B and C in a state where there is no reflection object, or the like occurs due to effects of the external disturbance light. Accordingly, it is not possible to correctly detect a position, a speed, or the like of the mobile object 10.

In contrast to this, in the first embodiment, the intersecting points Ts and Te are detected by performing a logical product of the output of the RS flip-flop 31 which receives the set signal (SET) and the reset signal (RSET) and an inverted signal of the set signal (SET) performed by the inverter 32, using the AND gate 35 in the logic circuit 30. Accordingly, it is possible to correctly detect the position, the movement speed, or the like of the mobile object 10 without being affected by the external disturbance light, as can be seen from FIG. 7-1 and FIG. 7-2.

This is due to the fact that, if the first, second, and third photodiodes A, B, and C are disposed as illustrated in FIG. 1-1 and, FIG. 1-2, when the reflection region (reflection detecting object) 11 faces the second photodiode B, a current of the output B is more than currents of the outputs A and C.

Second Embodiment

Figure 8:
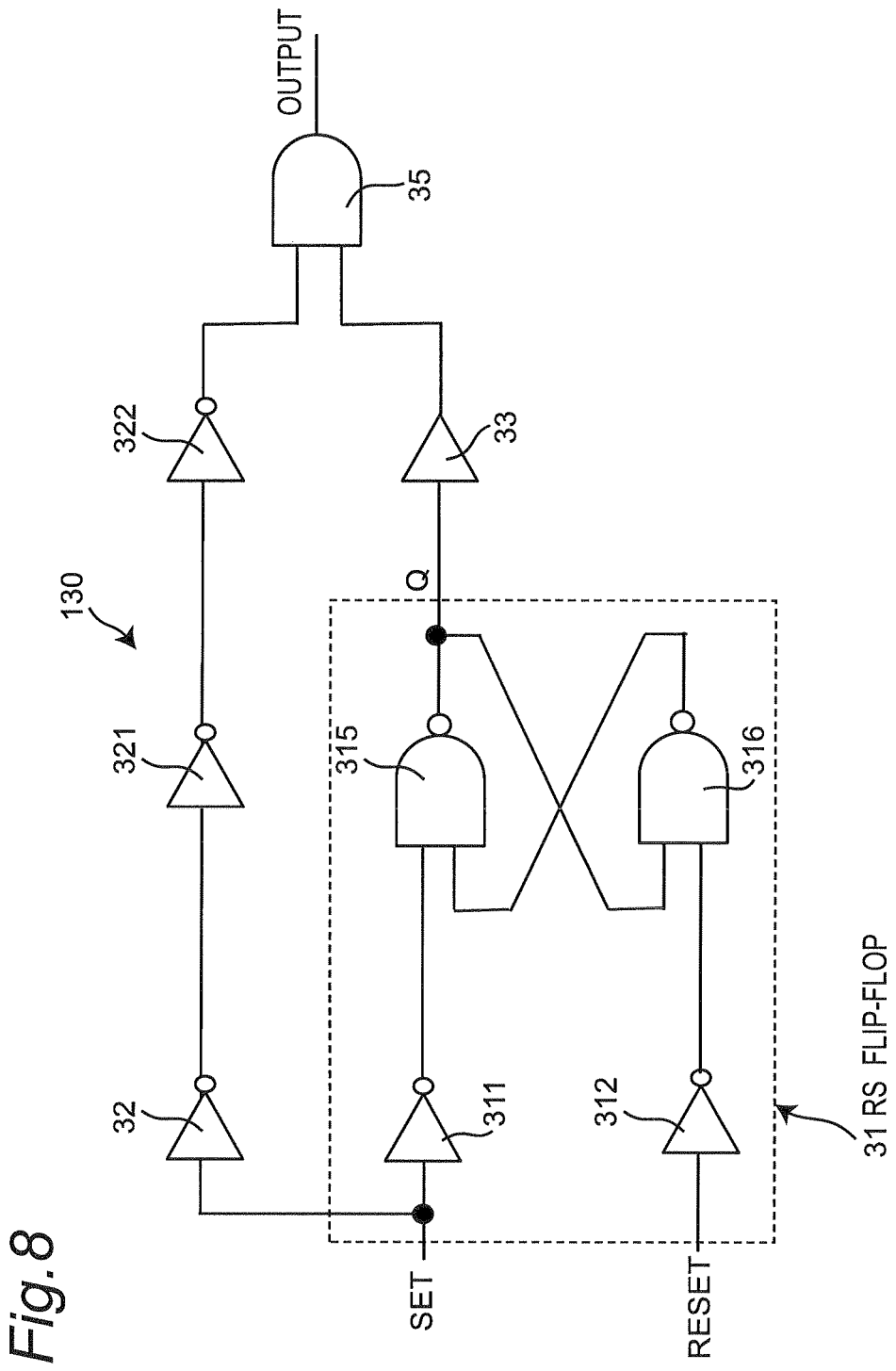
FIG. 8 is a block diagram of an essential portion of an optical encoder according to a second embodiment of the present invention.

An optical encoder according to a second embodiment is different from the first embodiment in that a logic circuit 130 has a configuration illustrated in FIG. 8. Hence, configurations and operations of the second embodiment except for the logic circuit 130 employ the description of the first embodiment illustrated in FIGS. 1-1, 1-2, . . . , 7-1, and 7-2, and the description will be omitted.

The logic circuit 130 according to the second embodiment illustrated in FIG. 8 is different from the logic circuit 30 according to the first embodiment illustrated in FIG. 6 only in that two inverters 321 and 322 are connected in series in a rear stage of the inverter 32 receiving the set signal (SET), and transmission of a signal is delayed by the inverters 321 and 322.

By doing so, the logic circuit 130 according to the second embodiment prevents a delay difference between an input from the RS flip-flop 31 to the AND gate 35 through the amplifier 33 and an input of the set signal, which passes through the inverters 32, 321, and 322, to the AND gate 35, from increasing.

Third Embodiment

Figure 9:
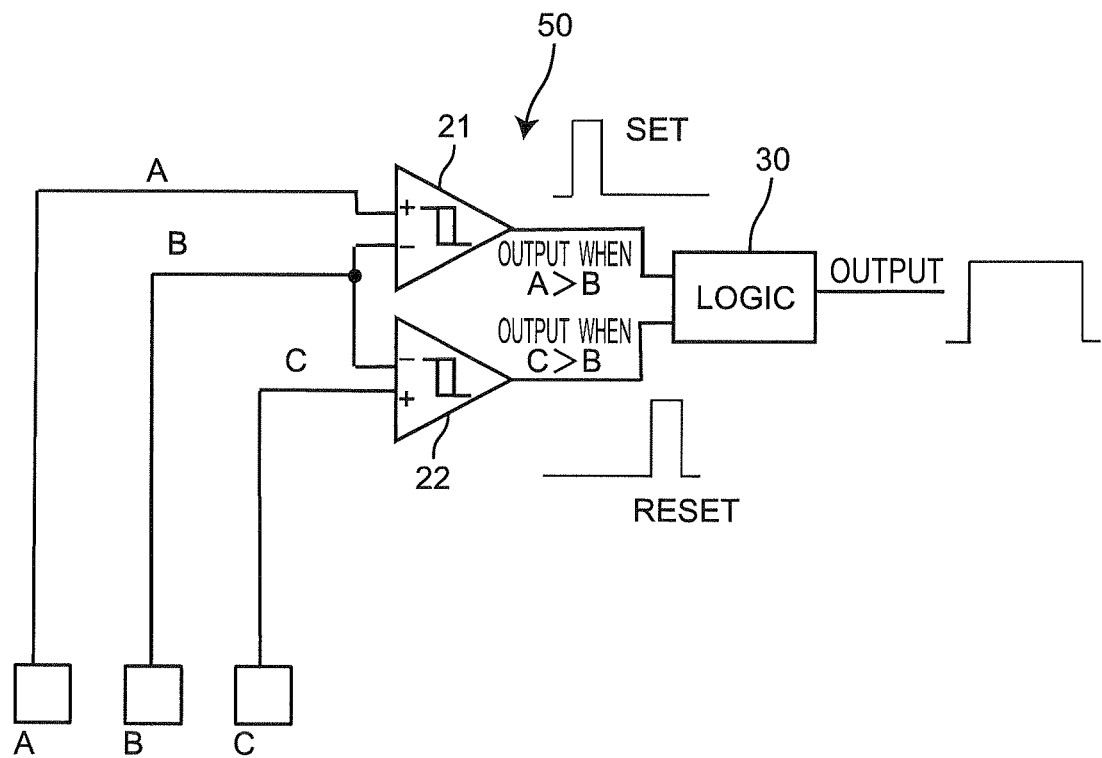
FIG. 9 is a block diagram of an essential portion of an optical encoder according to a third embodiment of the present invention.
Figure 9:
Figure 9:
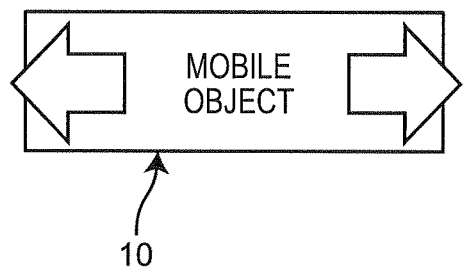

FIG. 9 is a block diagram illustrating an essential unit according to a third embodiment.

The third embodiment is different from the first embodiment only in that the first photodiode A, the second photodiode B, and the third photodiode C are disposed between the mobile object 10 and the light emitting diode 5, in the optical encoder according to the first embodiment illustrated in FIGS. 1-1, 1-2, . . . , 7-1, and 7-2, and in contrast to this, the light emitting diode 5 is disposed between the first photodiode A, the second photodiode B, and the third photodiode C and the mobile object 10, in an optical encoder according to the third embodiment illustrated in FIG. 9.

Hence, only a light path from the light emitting diode 5 to the first photodiode A, the second photodiode B, and the third photodiode C is different from each other in the third embodiment and the first embodiment, and thus, essentially, there is no difference between the third embodiment and the first embodiment.

In addition, other configurations and operations are all the same as those of the first embodiment, and thus, description thereof will be omitted.

Fourth Embodiment

Figure 10:
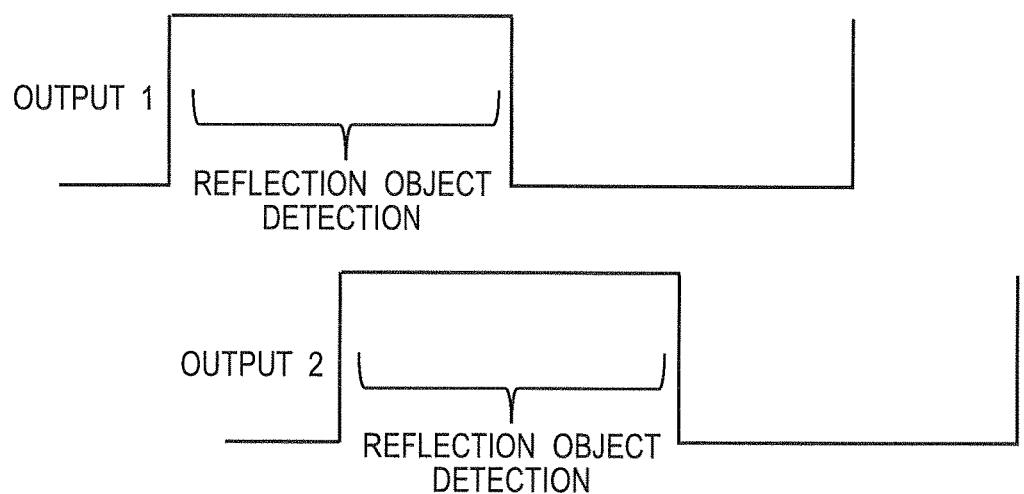
FIG. 10 is a waveform diagram illustrating an operation of an optical encoder according to a fourth embodiment of the present invention.
Figure 11:
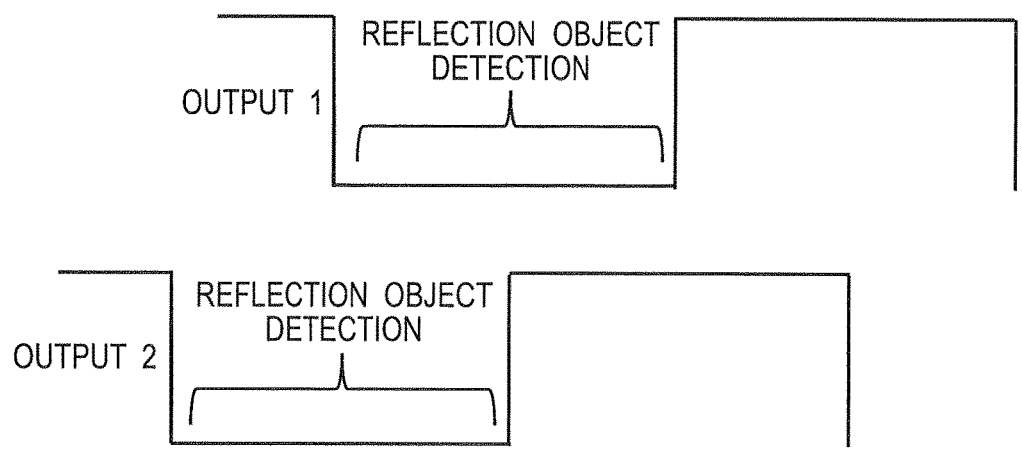
FIG. 11 is a waveform diagram illustrating the operation of the optical encoder according to the fourth embodiment of the present invention.

FIGS. 10 and 11 are graphs illustrating an operation of an optical encoder according to a fourth embodiment.

In the optical encoder according to the fourth embodiment, while not illustrated, light receiving positions of two sets of the first photodiode A, the second photodiode B, and the third photodiode C illustrated in FIG. 1-1 are arranged in a photodiode arrangement direction, and the detection signal generation unit 50 illustrated in FIG. 4 is provided in each set. Furthermore, while not illustrated, signal processing of outputs of each set may be performed by one detection signal generation unit in a time division.

If the mobile object 10 moves in a direction illustrated in FIG. 1-1 and the reflection region 11 of the mobile object 10 is detected (if the reflection object detection is performed), outputs of each set, as illustrated in FIG. 10, that is, an output 1 and an output 2 go to an H (high) level. The outputs go from L to H in the order of the output 1 and the output 2. A phase difference between the output 1 and the output 2 is 90°.

Meanwhile, if the mobile object 10 moves in a direction opposite to the direction illustrated in FIG. 1-1 and the reflection region 11 of the mobile object 10 is detected (if the reflection object detection is performed), outputs of each set, as illustrated in FIG. 11, that is, the output 1 and the output 2 go to an L (high) level. The outputs go from L to H in the order of the output 2 and the output 1.

Hence, according to the fourth embodiment, the order in which the output 1 and the output 2 go to an H level from an L level can be detected, and thereby a movement direction of the mobile object 10 can be easily detected.

Fifth Embodiment

Figure 12:
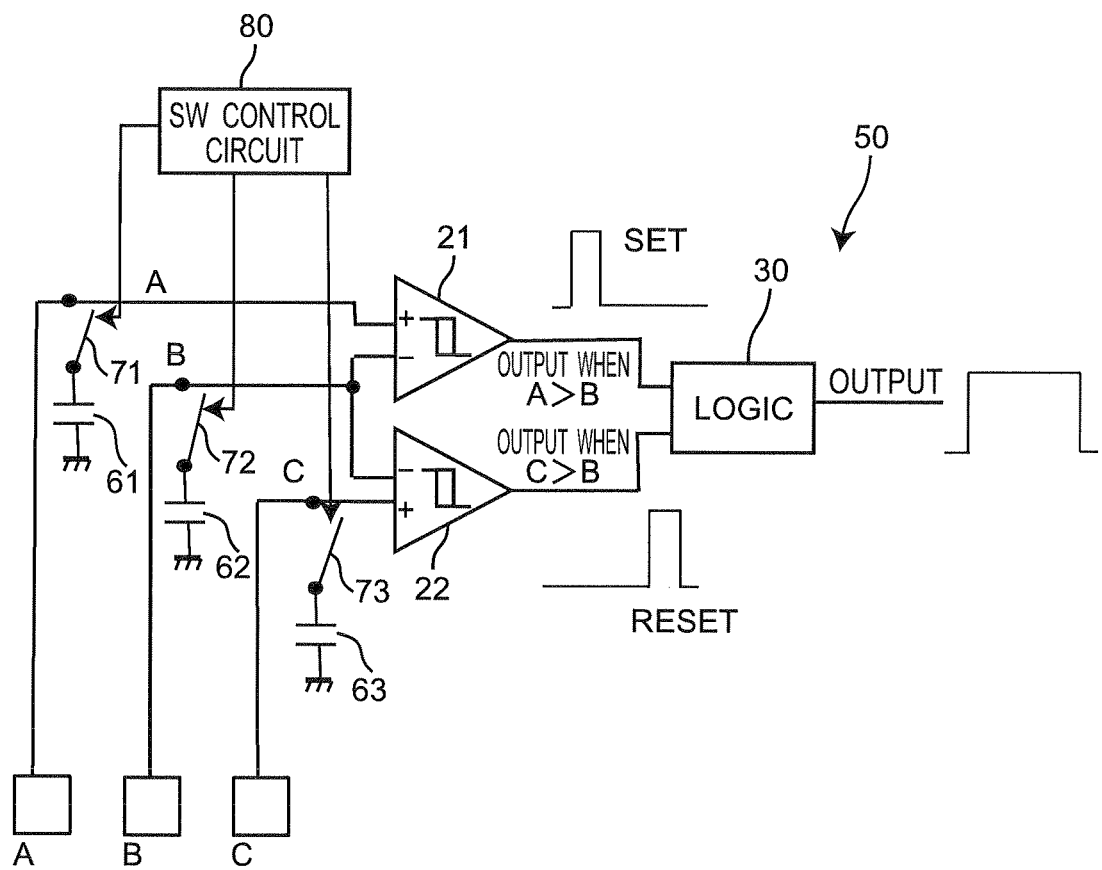
FIG. 12 is a block diagram of an essential portion of an optical encoder according to a fifth embodiment of the present invention.
Figure 12:
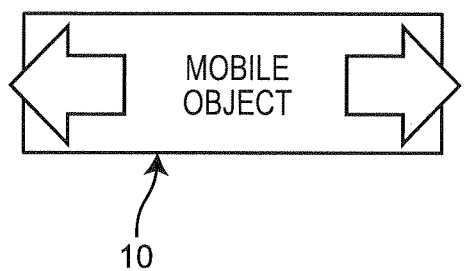

FIG. 12 is a block diagram of an optical encoder according to the fifth embodiment.

The optical encoder according to the fifth embodiment illustrated in FIG. 9 is different from the optical encoder according to the third embodiment only in that capacitors 61, 62, and 63 are respectively connected in parallel with the first photodiode A, the second photodiode B, and the third photodiode C through switches 71, 72, and 73, and a switch control circuit 80 which receives a signal from the logic circuit 30 and controls the switches 71, 72, and 73 are included. In FIG. 12, the same symbols or reference numerals are attached to the same configuration elements as the configuration elements according to the third embodiment illustrated in FIG. 9, and description thereof will be omitted.

After the set signal (SET) is outputted from the comparator 21, that is, when the output level A of the first photodiode A is higher than the output level B of the second photodiode B, the switch control circuit 80 receives a signal from the logic circuit 30 and controls the switch 72 such that the second photodiode B is separated from the capacitor 62, and controls the switch 73 such that the third photodiode C is connected to the capacitor 63.

In addition, after the reset signal (RSET) is outputted from the comparator 22, that is, when the output level C of the third photodiode C is lower than the output level B of the second photodiode B, the switch control circuit 80 receives a signal from the logic circuit 30 and controls the switch 73 such that the third photodiode C is separated from the capacitor 63.

In this way, the switches 71, 72, and 73 are controlled by the switch control circuit 80, the capacitors 61, 62, and 63 are respectively connected in parallel with the first photodiode A, the second photodiode B, and the third photodiode C, a signal delay occurs in the outputs A to C, and thus, it is possible to reliably generate intersecting points between the outputs A to C of the first to third photodiodes A to C.

A method of delaying the outputs A to C of the first to third photodiodes A to C is not limited to a method of connecting the aforementioned capacitors, and any method may be used if the capacitors are connected at an appropriate timing.

Sixth Embodiment

Figure 13:
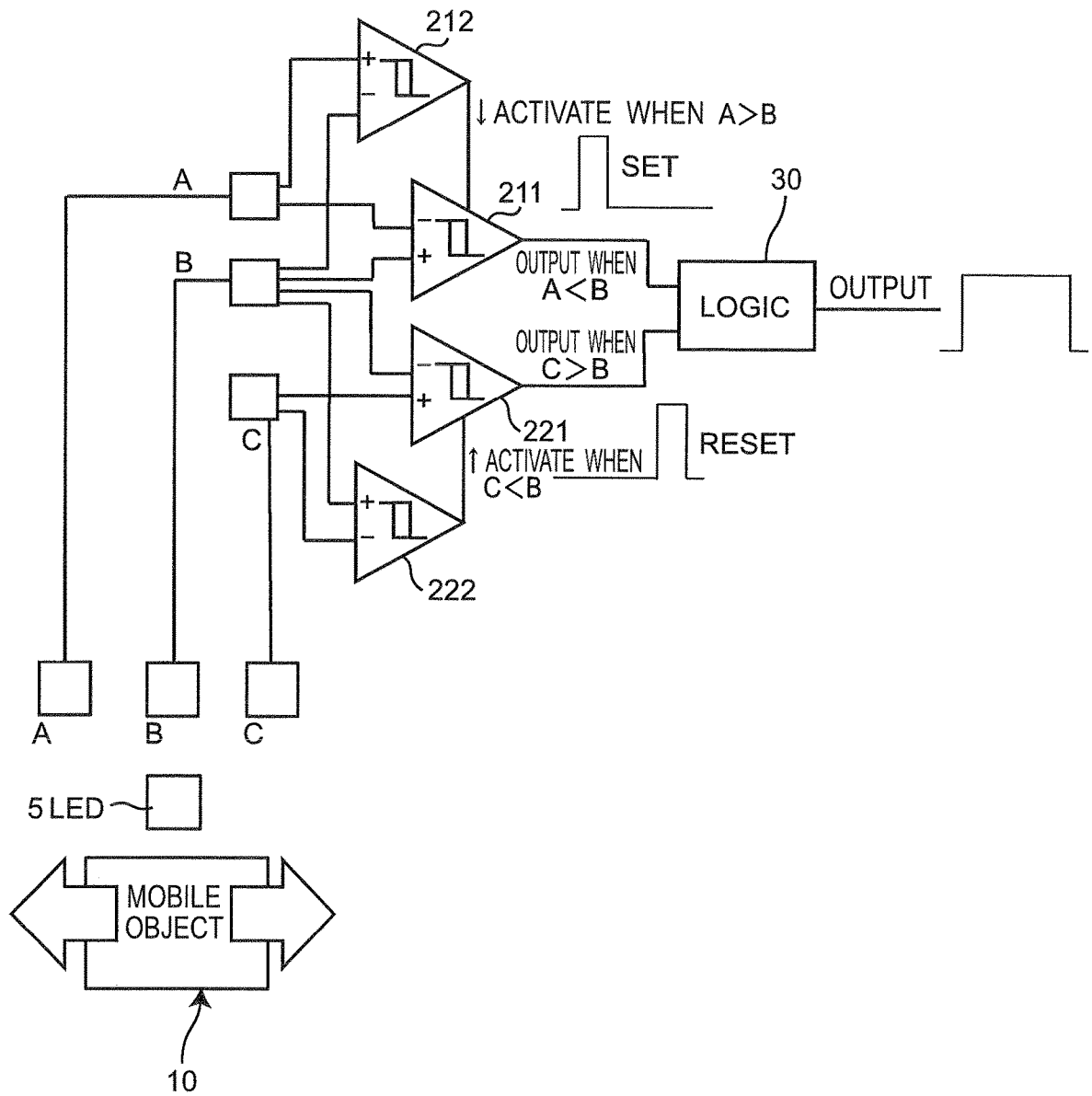
FIG. 13 is a block diagram of an essential portion of an optical encoder according to a sixth embodiment of the present invention.

FIG. 13 is a block diagram of an optical encoder according to a sixth embodiment.

The optical encoder according to the sixth embodiment illustrated in FIG. 13 is different from the optical encoder according to the third embodiment illustrated in FIG. 9 only in that main comparators 211 and 221 and sub-comparators 212 and 222 are used instead of the comparators 21 and 22 according to the third embodiment. In FIG. 13, the same symbols or reference numerals are attached to the same configuration elements as the configuration elements according to the third embodiment illustrated in FIG. 9, and description thereof will be omitted.

The sub-comparator 212 has a positive terminal receiving the output A of the first photodiode A, and a negative terminal receiving the output B of the second photodiode 2, and outputs an H (high level) signal, when A>B, and thereby the main comparator 211 is activated. Meanwhile, when A≤B, an L (low level) signal is outputted, and thereby an operation of the main comparator 211 stops. Switching of the H signal and the L signal of the sub-comparator 212 is performed with a certain hysteresis.

In addition, the main comparator 211 has a positive terminal receiving the output B of the second photodiode B, and a negative terminal receiving the output A of the first photodiode A, outputs an H signal when A<B, and outputs the set signal (SET) which becomes the L signal at a point of time when an output of the sub-comparator 212 becomes the L signal, with hysteresis.

In the same manner, the sub-comparator 222 has a positive terminal receiving the output B of the second photodiode B, and a negative terminal receiving the output C of the third photodiode C, and outputs the H signal, when B>C, and thereby the main comparator 221 is activated. Meanwhile, when B≤C, the L signal is outputted, and thereby an operation of the main comparator 221 stops. Switching of the H signal and the L signal of the sub-comparator 222 is performed with a certain hysteresis.

In addition, the main comparator 221 has a positive terminal receiving the output C of the third photodiode C, and a negative terminal receiving the output B of the second photodiode B, outputs an H signal when B<C, and outputs the reset signal (RSET) which goes to a low level at a point of time when an output of the sub-comparator 222 becomes the L signal, with hysteresis.

In this way, the main comparators 211 and 221 are activated by the H signal from the sub-comparators 212 and 222, and output the set signal (SET) and a reset signal (RSET) during a short period of only hysteresis period of the sub-comparators 212 and 222, if outputs are obtained from the main comparators 211 and 221.

Hence, others except for the change of the incident light illustrated in FIG. 5 are not detected, and thus, it is possible to prevent an abnormal operation from being performed.

Seventh Embodiment

While not illustrated, an electronic apparatus according to a seventh embodiment is, for example, a copier, a printing apparatus such as a printer, a factory automation (FA) apparatus, a lens focus adjusting device of a camera or the like, a speed detection device for vehicle which detects a rotation angle, a speed, or the like of a crank shaft, and includes one of the optical encoders according to the first to sixth embodiments.

The electronic apparatus does not depend upon slit or a resolution of a reflection region of a mobile object, and does not depend upon variation of an optical encoder, and thus, a high signal to noise (SN) ratio can be held, and the optical encoder which can detect a position, a movement speed, or the like of a mobile object, with high accuracy. Accordingly, performance is excellent.

In the embodiments, the photodiodes are used as an example of a light receiving element, but any types of elements which can detect light such as a phototransistor may be used. In addition, the light emitting element is not limited to the LED, and any types of elements which can emit light such as a semiconductor laser may be used.

In addition, configurations of the detection signal generation unit 50 and the logic circuit 30 are not limited to the embodiments, and various configurations can be used. For example, the logic circuit can be configured by combining logic elements such as a NAND gate or a NOR gate. In addition, a JK flip-flop may be used instead of an RS flip-flop.

The present invention and the embodiments can be summarized as follows.

In order to solve the problems, an optical encoder according to the present invention includes first, second, and third light receiving elements A, B, and C that are sequentially disposed and adjacent to each other, and a detection signal generation unit 50 that outputs a detection trigger Ts when an output level B of the second light receiving element B that receives incident light after the first light receiving element A is higher than an output level A of the first light receiving element A that precedently receives the incident light, and outputs a non-detection trigger Te when an output level C of the third light receiving element C that receives incident light after the second light receiving element B is higher than the output level B of the second light receiving element B.

According to the optical encoder having the configuration, while the detection signal generation unit 50 outputs the detection trigger Ts when the output level B of the second light receiving element B that receives incident light after the first light receiving element A is higher than the output level A of the first light receiving element A that precedently receives the incident light, the detection signal generation unit 50 outputs the non-detection trigger Te when the output level C of the third light receiving element C that receives incident light after the second light receiving element B is higher than the output level B of the second light receiving element B.

Hence, the optical encoder does not depend upon a resolution of a slit width or the like of the mobile object 10, and does not depend upon variation of an optical system. Accordingly, it is possible to hold a high SN ratio and to detect a position, a movement speed, or the like of the mobile object 10, with high accuracy.

In addition, according to the optical encoder, while the intersecting point Ts between the output A of the first light receiving element A and the output B of the second light receiving element B is set to the detection trigger Ts, the intersecting point Te between the output B of the second light receiving element B and the output C of the third light receiving element C is set to the non-detection trigger Te, and thus, the intersecting points Ts and Te are not affected by external disturbance light, even if the amount of incident light changes. Hence, it is possible to prevent an abnormal operation from being performed and to correctly detect a position, a movement speed, or the like of the mobile object 10.

The optical encoder according to the first embodiment includes, a light emitting element 5 that has an optical axis overlapping an optical axis of the second light receiving element B, and a window portion 7 that narrows light receiving apertures of the first and third light receiving elements A and C.

According to the embodiment, the light receiving aperture of the second light receiving element B located at the center is not narrowed by the window portion 7 and the light receiving apertures of the first and third light receiving elements A and C located at both ends are narrowed by the window portion 7, and thus, it is possible to stably and reliably obtain the intersecting points Ts and Te in which the light receiving current B of the second light receiving element B is more than the light receiving currents A and C of the first and third light receiving elements A and C. Hence, the detection trigger Ts and non-detection trigger Te can be reliably obtained, the optical encoder does not depend upon a resolution of a slit width or the like of the mobile object 10, and does not depend upon variation of an optical system. Accordingly, it is possible to hold a high SN ratio and to detect a position, a movement speed, or the like of the mobile object 10, with high accuracy.

In the optical encoder according to the first embodiment, areas of light receiving portions of the first, second, and third light receiving elements A, B, and C are substantially the same.

According to the embodiments, areas of the light receiving portions of the first, second, and third light receiving elements A, B, and C are substantially the same, and thus, a common mode noise can be reduced by performing a differential operation, and the embodiments are beneficial.

In the optical encoder according to the first embodiment, two sets of elements each including the first, second, and third light receiving elements A, B, and C are arranged in juxtaposition to each other.

According to the embodiments, a movement direction of the mobile object 10 can be simply detected by detecting the order in which two sets of the outputs go from an L level to an H level (or form an H level to an L level).

The optical encoder according to the first embodiment includes:

capacitors 61, 62, and 63 that can be respectively connected to the first, second, and third light receiving elements A, B, and C through switches 71, 72, and 73, and that are each connected in parallel with respective light receiving elements; and a switch control circuit 80 that controls the switches 71, 72, and 73.

According to the embodiments, the switches 71, 72, and 73 are controlled by the switch control circuit 80, the capacitors 61, 62, and 63 are respectively connected in parallel with the first light receiving element A, the second light receiving element B, and the third light receiving element C, a signal delay occurs in the outputs A to C, and thus, it is possible to reliably generate intersecting points between the outputs A to C of the first to third photodiodes A to C.

An electronic apparatus according to the embodiment includes the optical encoder.

Since the electronic apparatus includes the optical encoder which does not depend upon a slit or a resolution of a reflection region of the mobile object and does not depend upon variation of an optical system and thus can hold a high SN ratio and can detect a position, a movement speed, or the like of the mobile object, with high accuracy, the electronic apparatus has excellent performance.

The configuration elements described in the first to seventh embodiments and modification examples may be appropriately combined, and may also be appropriately selected, replaced, or removed.

REFERENCE SIGNS LIST

5 LIGHT RECEIVING ELEMENT
7 WINDOW PORTION
10 MOBILE OBJECT
21, 22, 211, 212, 221, 222 COMPARATOR
30, 130 LOGIC CIRCUIT
50 DETECTION SIGNAL GENERATION UNIT
61, 62, 63 CAPACITOR
71, 72, 73 SWITCH
80 SWITCH CONTROL CIRCUIT
A FIRST LIGHT RECEIVING ELEMENT
B SECOND LIGHT RECEIVING ELEMENT
C THIRD LIGHT RECEIVING ELEMENT
Ts DETECTION TRIGGER
Te NON-DETECTION TRIGGER

The invention claimed is:

1. An optical encoder comprising:

first, second, and third light receiving elements that are sequentially disposed and adjacent to each other with a pitch therebetween; and a detection signal generation unit that outputs a detection trigger when an output level of the second light receiving element that receives incident light after the first light receiving element is higher than an output level of the first light receiving element that precedently receives the incident light, and outputs a non-detection trigger when an output level of the third light receiving element that receives incident light after the second light receiving element is higher than the output level of the second light receiving element, further comprising:

a light emitting element that has an optical axis substantially overlapping an optical axis of the second light receiving element;

a mobile object which includes reflection regions and transmission regions which are alternately arranged at an equally spaced interval to define a pitch between successive reflection regions and a pitch of successive transmission regions, wherein the pitch of the reflection regions and the pitch of the transmission regions of the mobile object are larger than the pitch of the first, second, and third light receiving elements; and a stationary window portion that does not narrow a light receiving aperture of the second light receiving element located between the first and third light receiving elements and that narrows light receiving apertures of the first and third light receiving elements, wherein the stationary window portion is provided between the mobile object and the first, second, and third light receiving elements.

2. The optical encoder according to claim 1, wherein the light emitting element is disposed such that light emitted from the light emitting element and then reflected by a reflection region of the mobile object enters the first, second and third light receiving elements.

3. The optical encoder according to claim 1, wherein the detection signal generation unit includes a first comparator configured to receive outputs of the first and second light receiving elements, a second comparator configured to receive outputs of the second and third light receiving elements, and a logic circuit configured to receive outputs of the first and second comparators, the first comparator is configured to output a first pulse signal (SET) that rises when the output of the first light receiving element becomes larger than that of the second light receiving element and falls when the output of the second light receiving element becomes larger than that of the first light receiving element, while the second comparator is configured to output a second pulse signal (RESET) that rises when the output of the third light receiving element becomes larger than that of the second light receiving element and falls when the output of the second light receiving element becomes larger than that of the third light receiving element, and the logic circuit is configured to output an output voltage that rises at the falling of the first pulse signal and falls at the rising of the second pulse signal, wherein the rising of the output voltage corresponds to the detection trigger, and the falling of the output voltage corresponds to the non-detection trigger.

4. An optical encoder comprising:

first, second, and third light receiving elements that are sequentially disposed and adjacent to each other; and a detection signal generation unit that outputs a detection trigger when an output level of the second light receiving element that receives incident light after the first light receiving element is higher than an output level of the first light receiving element that has previously received the incident light, and outputs a non-detection trigger when an output level of the third light receiving element that receives incident light after the second light receiving element is higher than the output level of the second light receiving element, further comprising:

a light emitting element that has an optical axis substantially overlapping an optical axis of the second light receiving element;

a mobile object which includes reflection regions and transmission regions which are alternately arranged at an equally spaced interval to define a pitch between successive reflection regions and a pitch of successive transmission regions, wherein the pitch of the reflection regions and the pitch of the transmission regions of the mobile object are larger than the pitch of the first second, and third light receiving elements; and a stationary window portion that does not narrow a light receiving aperture of the second light receiving element located between the first and third light receiving elements and that narrows light receiving apertures of the first and third light receiving elements, wherein the stationary window portion is provided between the mobile object and the first, second, and third light receiving elements, and wherein the stationary window portion includes a central aperture and a part by which the central aperture is defined, the part overlapping part of the light receiving apertures of the first and third light receiving elements but not overlapping the light receiving aperture of the second light receiving element.

5. The optical encoder according to claim 4, wherein lengths of the reflection regions and the transmission regions of the mobile object are larger than a width of the central aperture of the stationary window portion.

6. The optical encoder according to claim 4, wherein the light emitting element is disposed such that light emitted from the light emitting element and then reflected by a reflection region of the mobile object enters the first, second and third light receiving elements.

7. The optical encoder according to claim 4, wherein the detection signal generation unit includes a first comparator configured to receive outputs of the first and second light receiving elements, a second comparator configured to receive outputs of the second and third light receiving elements, and a logic circuit configured to receive outputs of the first and second comparators, the first comparator is configured to output a first pulse signal (SET) that rises when the output of the first light receiving element becomes larger than that of the second light receiving element and falls when the output of the second light receiving element becomes larger than that of the first light receiving element, while the second comparator is configured to output a second pulse signal (RESET) that rises when the output of the third light receiving element becomes larger than that of the second light receiving element and falls when the output of the second light receiving element becomes larger than that of the third light receiving element, and the logic circuit is configured to output an output voltage that rises at the falling of the first pulse signal and falls at the rising of the second pulse signal, wherein the rising of the output voltage corresponds to the detection trigger, and the falling of the output voltage corresponds to the non-detection trigger.

\* \* \* \* \*